United States Patent [19]
Lubeck

[11] Patent Number: 5,305,281
[45] Date of Patent: Apr. 19, 1994

[54] MULTIPLE ARRAY MEMORY DEVICE WITH STAGGERED READ/WRITE FOR HIGH SPEED DATA ACCESS

[75] Inventor: Paul R. Lubeck, San Jose, Calif.

[73] Assignee: National Semiconductor Corporation, Santa Clara, Calif.

[21] Appl. No.: 926,483

[22] Filed: Aug. 6, 1992

[51] Int. Cl.$^5$ .............................................. G11C 8/00
[52] U.S. Cl. ........................... 365/230.04; 365/189.05; 365/230.03; 365/230.08; 365/239
[58] Field of Search ................. 365/230.03, 189.05, 365/239, 230.06, 230.04, 219, 189.12, 230.08

[56] References Cited

U.S. PATENT DOCUMENTS

| | | | |
|---|---|---|---|
| 4,646,272 | 2/1987 | Takasugi | 365/239 X |
| 4,802,132 | 1/1989 | Ohsawa | 365/230.03 |
| 4,817,054 | 3/1989 | Banerjee et al. | 365/239 X |
| 4,849,937 | 7/1989 | Yoshimoto | 365/230.04 X |
| 4,855,959 | 8/1989 | Kobayashi | 365/239 |
| 5,136,546 | 8/1992 | Fukuda et al. | 365/189.05 X |

Primary Examiner—Eugene R. LaRoche
Assistant Examiner—Do Hyun Yoo
Attorney, Agent, or Firm—Townsend and Townsend Khourie and Crew

[57] ABSTRACT

A multiple array memory device formed on a single IC chip performing transfers of a series of data between the device and its interface at high speed. The device includes a memory having a plurality of groups of memory arrays. In a read operation, the device internally reads data from sequential locations starting at any desired address and extending across the memory arrays into a latch. As the data are output to the interface from the latch, sequential data from an adjacent group of array in the memory are internally read into the latch. Thus, a series of data can be output to the interface at high speed. The write operation is performed in a similar manner.

8 Claims, 11 Drawing Sheets

MULTIPLE ARRAY MEMORY DEVICE WITH STAGGERED READ/WRITE FOR HIGH SPEED DATA ACCESS

BACKGROUND OF THE INVENTION

The invention relates generally to memory devices, more particularly, to a multiple array memory device for high speed data access.

Many attempts have been made to maximize the speed of memory devices beyond the basic memory technology. Conventionally, high speed access is achieved by operating on an internal memory word within the device that is several times, typically two or four times, the external word width at the interface of the device. Therefore, when a memory read is requested, the device reads not only the requested data but also additional data that are not yet requested and holds those additional data in a buffer making them available for reduced time access if they are subsequently requested. The same technique is implemented for a write cycle in that when a memory write is requested, the device holds the write data in a buffer until several other data words have been written into the buffer. The device then updates the memory cells with the write data.

There are several disadvantages to the conventional device. First, the high speed access is limited to the internal word width. That is, if the internal word width is four times the external word width, the high speed access mode is valid for a maximum of four external words. Secondly, this type of device naturally creates address boundaries. That is, the high speed access mode is valid only for four external words that align with the larger internal words. Moreover, to efficiently use the high speed access mode, the starting and ending addresses of external words must be aligned with the address of the internal word. Such alignment requires additional internal circuitry to count addresses and/or roll the addresses over to the least significant address in the internal word when the most significant address in the internal word is reached.

Early memory systems used cabinet technology in which several cabinets each containing a section of memory are connected. In operation, data could be input into or output from one cabinet while other cabinets were being accessed. Thus, access time could be reduced. However, this arrangement was too bulky and impractical. Additionally, such an arrangement was a distinct memory system composed of many devices of singular architecture forming a different overall architecture and not a single memory architecture nor a single chip architecture.

A high speed memory device of single architecture that allows faster access of data than the process technology inherently permits without the disadvantages described above is thus needed.

SUMMARY OF THE INVENTION

The present invention provides a multiple array memory device on a single integrated circuit (IC) chip which allows the high speed access to begin at any address and continue for any number of a sequential address locations in the high speed mode. This high speed access is accomplished by internally accessing the memory locations in advance to allow the external interface of the device to remain in a high speed mode indefinitely.

According to one aspect of the invention, the memory device includes a plurality of groups of memory arrays. In one embodiment, the memory device has an upper group and a lower group, within each group there is array 0 and array 1. A single array has the same width as the data interface of the memory device.

According to another aspect of the invention, latches are provided for transferring data to and from the memory arrays. The latches for the lower group of memory arrays have independent control from the latches for the upper group of memory arrays. Sense amplifiers are provided for reading the memory arrays.

According to another aspect of the invention, a multiplexer-demultiplexer and buffers are provided to select the routing of the data between the device interface and the memory arrays.

According to a further aspect of the invention, a control logic unit is provided to control reading and writing of the memory on a group-by-group basis; the latches on an array-by-array basis; the sense amplifiers on a group-by-group basis; and the multiplexer-demultiplexer data transfer direction and path between the interface and latches on an array-by-array basis.

According to a further aspect of the invention, sequentially stored or retrieved data words are stored or retrieved in separate memory arrays, one data word in each array in a predetermined sequence, the predetermined sequence to be repeated until the data transfer is completed. In this way, data transfers with respect to a selected number of sequential memory locations can be performed alternatively on a group-by-group basis between the memory and the latches and between the latches and the multiplexer-demultiplexer. The multiplexer-demultiplexer connects to the memory device interface via the buffers. Thus, continuous, sequential transfers of a series of data between the selected number of sequential memory locations and the interface can be performed.

Thus, to begin a read cycle, the IC reads data into the latches from the groups of memory arrays, the beginning address being any desired address and the groups of memory arrays read determined by the beginning address. The data from the addressed memory array is routed through the multiplexer—demultiplexer to the buffers and to the IC output. Subsequently, the next sequential data already held in the latches is routed through the multiplexer—demultiplexer to the buffers and to the IC outputs in the high speed mode. As all of the data from a group of memory arrays is sent to the IC interface in the above described manner, the address to that group of memory arrays is incremented and the data from the incremented address is read into the latches while the data from the sequential group of memory arrays is being routed from the latches to the IC interface in the high speed mode. Therefore, by alternatively accessing one group of memory arrays, while the data from another group of memory arrays is being routed from the latches to the IC interface, the data read is maintained in the high speed mode continuously for any number of sequential data.

Similarly, in a write cycle, the IC inputs data into the latches and on an alternate basis, internally writes data from the latches into the group of arrays beginning at any desired address. In this manner, when the IC begins to internally write data into a group of array from the latches, the IC inputs sequential data from the interface into the latches to be written into an adjacent group of arrays if the sequential data are not being held in the latches. Therefore, the IC can be maintained to continuously input any desired number of sequential data into the memory from the interface at high speed.

Thus the invention can begin bursts at any word address for any number of sequential words. It does not require external addressing.

The further understanding of the nature and advantages of the invention may be realized by reference to the remaining portions of the specification and the drawings.

DESCRIPTION OF THE PREFERRED EMBODIMENT

Figure 1:
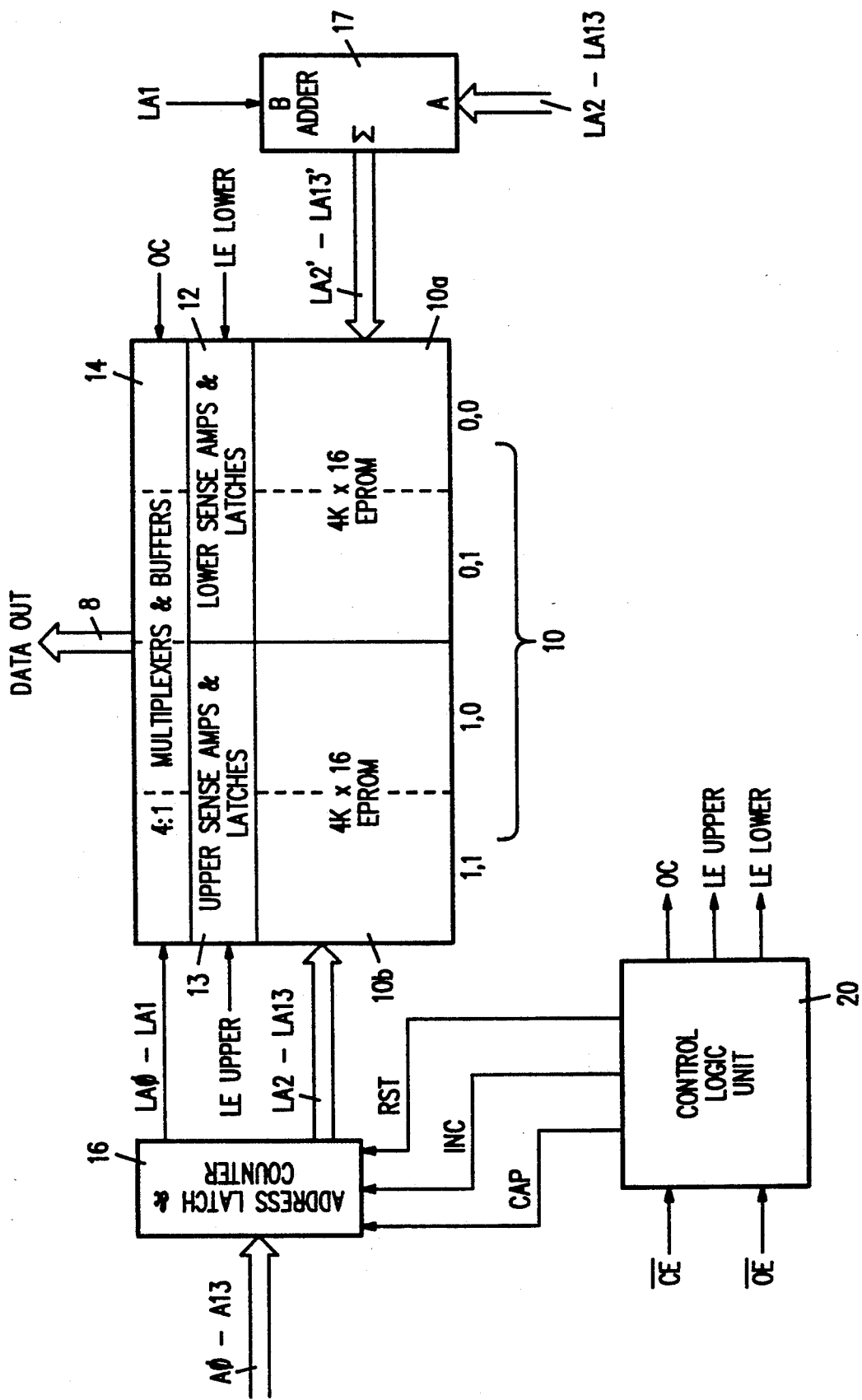
FIG. 1 is a block diagram of the memory device of the invention.

FIG. 1 shows the multiple array memory device of the invention. The entire memory device is implemented on a single monolithic semiconductor integrated circuit (IC) chip. It includes a memory 10 having a plurality of rows of memory locations. In the preferred embodiment two 4K×16 EPROM memory array groups are used. The memory is divided into four arrays 0,0, 0,1, 1,0, and 1,1, although the desired result can be obtained with any number of divisions greater than two arrays. The two bits are the binary address of the array and correspond to LA0 and LA1. Arrays 0,0 and 0,1 are arranged in a lower group 10a and arrays 1,0 and 1,1 in an upper group 10b. Groups 10a and 10b are electrically separated from each other. The arrays in each group, however, are a single electrical entity although they are viewed as separated arrays for illustration purposes. The arrays in each group are paired for the purpose of accessing the group at the same time. The word width of each array can be any bit count on the horizontal axis. The depth of the array, which is the total number of words in the array, can be any word count on the vertical axis. Memory 10 is coupled to sense amplifiers/latches 12, lower, and 13, upper which, in turn, are coupled to 4:1 multiplexer-demultiplexer/buffers 14. An address latch/counter 16 is coupled to multiplexer 14 and lower group 10b to supply input addresses. A control logic unit 20 is coupled to latch/counter 16 for controlling the supplying of the input addresses by latch/counter 16. An address adder 17 is coupled to address latch counter 16 and to lower group 10a for supplying input addresses to lower group 10a.

An overview of the operation of the IC memory device will now be described with respect to FIG. 1. The initial access to memory 10 can be made at any address that resides in any row of any one array in the memory. In a read operation, control logic unit 20 first instructs latch/counter 16 to take the starting address off the address bus to access memory 10. The latched address bits LA0 and LA1 are supplied to multiplexer/buffers 14 for selecting a desired array in the memory. The latched address bit LA1 applied to adder 17 is added to the latched address bits LA2-LA13 to form LA2'-LA13', which are used to access the next sequential row in the lower group 10a when the accessing starts in a row in the upper group since all arrays are initially accessed together although the rows in the groups may be different depending on LA1. The data from the arrays are internally read into sense amplifiers/latches 12 and 13. Of the data stored in latches 12 and 13, only data from one array is selected by multiplexer/buffers 14 to be presented at the external interface of the IC at any given time. The selection of an array is determined by the input address bits LA0 and LA1 applied to multiplexer/buffers 14.

The data from lower group 10a are sequentially output from latches 12 through buffers 14. As the IC outputs the data from upper group 10b from latches 13, the IC also internally accesses the next higher row in lower group 10a and reads the data therein to latches 12. Thereafter, the two groups are accessed in a sequential manner with arrays 0,0 and 0,1 being accessed together and arrays 1,0 and 1,1 being accessed together. Then, the data from the arrays in lower group 10a is output to the external interface from latches 12 while the arrays in upper group 10b are being accessed and loaded into latches 13. By accessing arrays 1,0 and 1,1 while data from arrays 0,0 and 0,1 are being output from latches 12, the data from arrays 1,0 and 1,1 will be held in latches 13 by the time, or in a shorter time before, the data are completely output.

In a write operation, data words are first input into latches 12 and latches 13 through demultiplexer/buffers 14 until the latches associated with an array group has been filled. Then the data are sequentially written into the array group beginning at the desired initial address on a group-by-group basis. Thus, the data can be input into latches 12 for lower group 10a while the data are being written into upper group 10b from latches 13. By writing data into arrays 1,0 and 1,1 while data for arrays 0,0 and 0,1 are being input into latches 12, the IC will finish writing the data into arrays 1,0 and 1,1 by the time, or in a shorter time before, the data are completely input.

The invention can be best understood by considering an example which describes one possible sequence of events during a read operation. For simplicity, the necessary interface signals are not discussed as they are evident to a person of ordinary skill in the art.

The following table shows the read sequence for the memory of the invention.

| Address Bits | | | | Internally Read Array Row From | | | | | | Output Word | From Array |
|---|---|---|---|---|---|---|---|---|---|---|---|
| | | | | Lower Group | | | Upper Group | | | | |
| A3 | A2 | A1 | A0 | A6 | A5 | A4 | A6 | A5 | A4 | | |
| 0 | 0 | 0 | 0 | 0 | 0 | 0 | 0 | 0 | 0 | 0 | 0,0 |
| 0 | 0 | 0 | 1 | 0 | 0 | 0 | 0 | 0 | 0 | 1 | 0,1 |
| 0 | 0 | 1 | 0 | 0 | 0 | 1 | 0 | 0 | 0 | 2 | 1,0 |
| 0 | 0 | 1 | 1 | 0 | 0 | 1 | 0 | 0 | 0 | 3 | 1,1 |
| 0 | 1 | 0 | 0 | 0 | 0 | 1 | 0 | 0 | 1 | 4 | 0,0 |
| 0 | 1 | 0 | 1 | 0 | 0 | 1 | 0 | 0 | 1 | 5 | 0,1 |
| 0 | 1 | 1 | 0 | 0 | 1 | 0 | 0 | 0 | 1 | 6 | 1,0 |
| 0 | 1 | 1 | 1 | 0 | 1 | 0 | 0 | 0 | 1 | 7 | 1,1 |

-continued

| Address Bits | | | | Internally Read Array Row From | | | | | | Output Word | From Array |
|---|---|---|---|---|---|---|---|---|---|---|---|
| | | | | Lower Group | | | Upper Group | | | | |
| A3 | A2 | A1 | A0 | A6 | A5 | A4 | A6 | A5 | A4 | | |
| 1 | 0 | 0 | 0 | 0 | 1 | 0 | 0 | 1 | 0 | 8 | 0,0 |
| 1 | 0 | 0 | 1 | 0 | 1 | 0 | 0 | 1 | 0 | 9 | 0,1 |
| 1 | 0 | 1 | 0 | 0 | 1 | 1 | 0 | 1 | 0 | 10 | 1,0 |
| 1 | 0 | 1 | 1 | 0 | 1 | 1 | 0 | 1 | 0 | 11 | 1,1 |
| 1 | 1 | 0 | 0 | 0 | 1 | 1 | 0 | 1 | 1 | 12 | 0,0 |
| 1 | 1 | 0 | 0 | 0 | 1 | 1 | 0 | 1 | 1 | 13 | 0,1 |
| 1 | 1 | 0 | 1 | 0 | 0 | 0 | 1 | 1 | 1 | 14 | 1,0 |
| 1 | 1 | 1 | 1 | 0 | 0 | 0 | 1 | 1 | 1 | 15 | 1,1 |

Figure 2A:
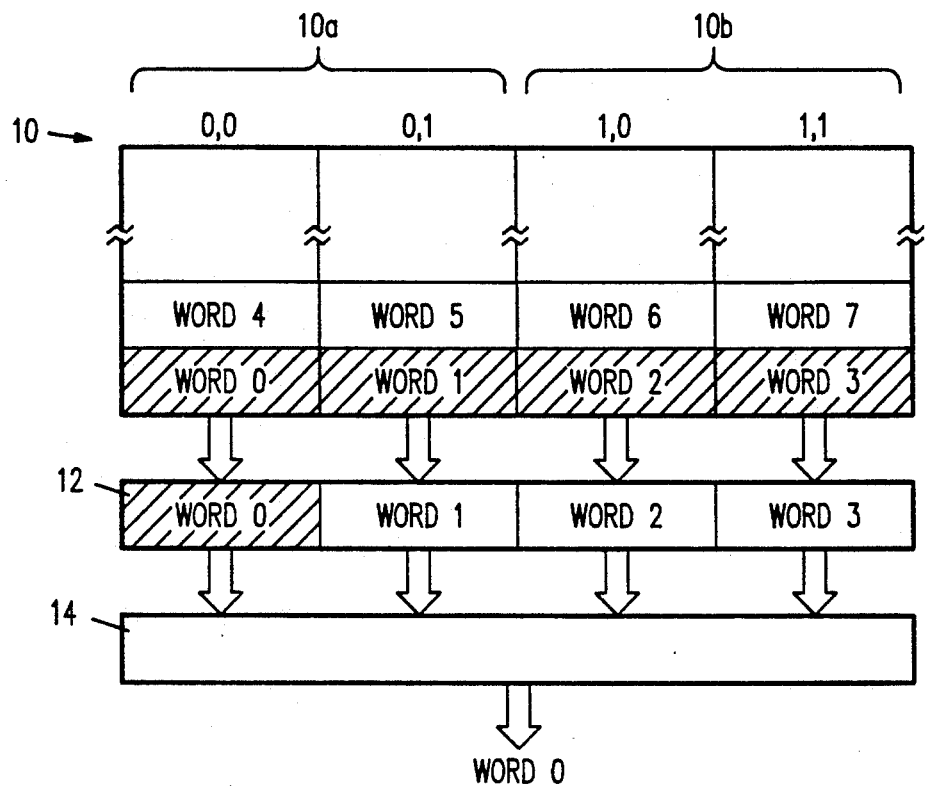
FIGS. 2A-2E illustrate an example of reading a series of sequential data out of the memory to the interface according to the invention.
Figure 2B:
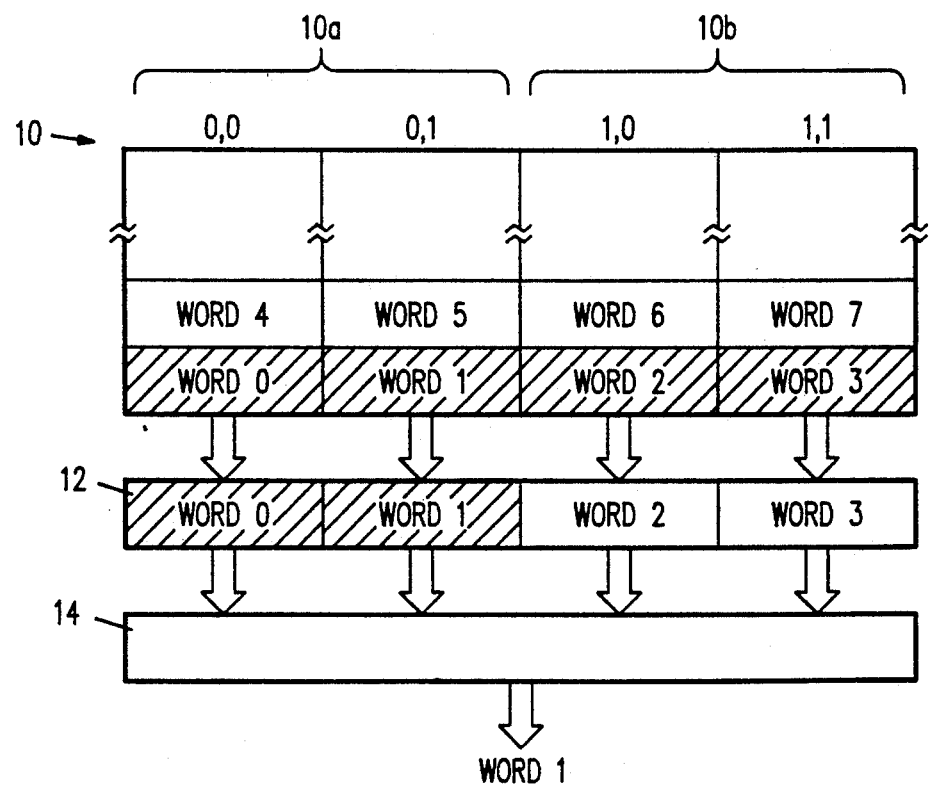
Figure 2C:
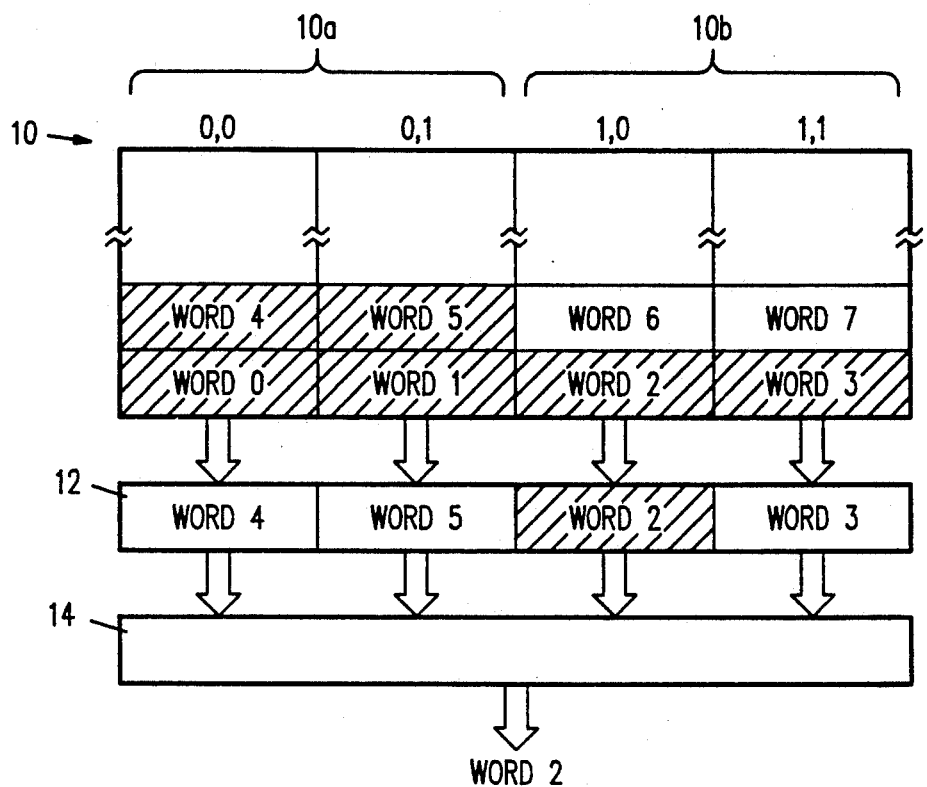
Figure 2D:
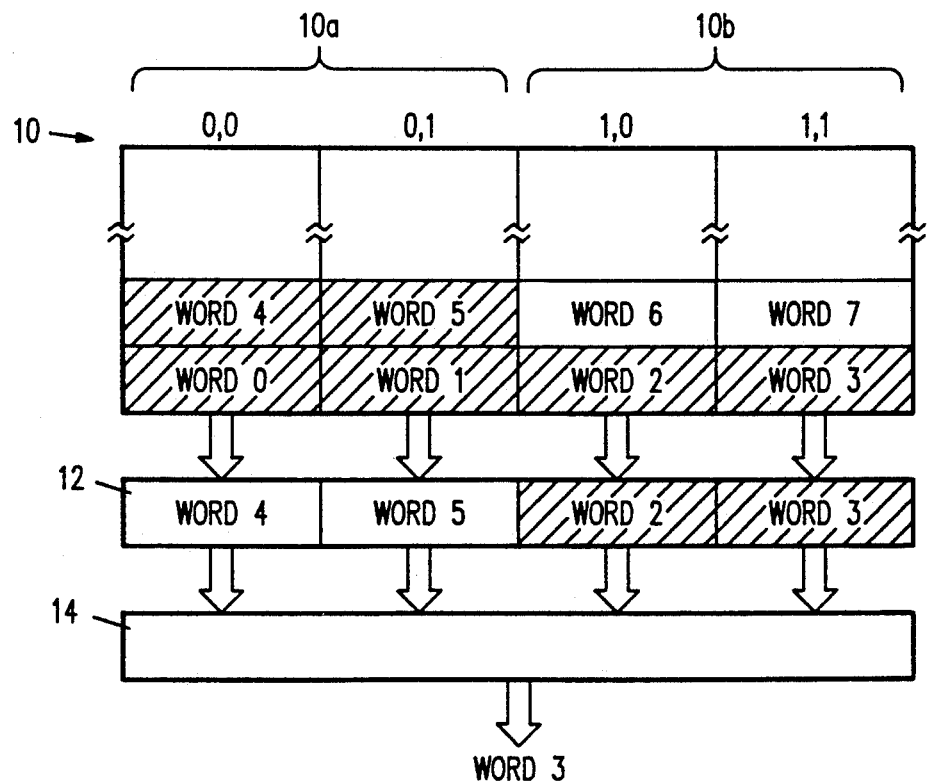
Figure 2E:
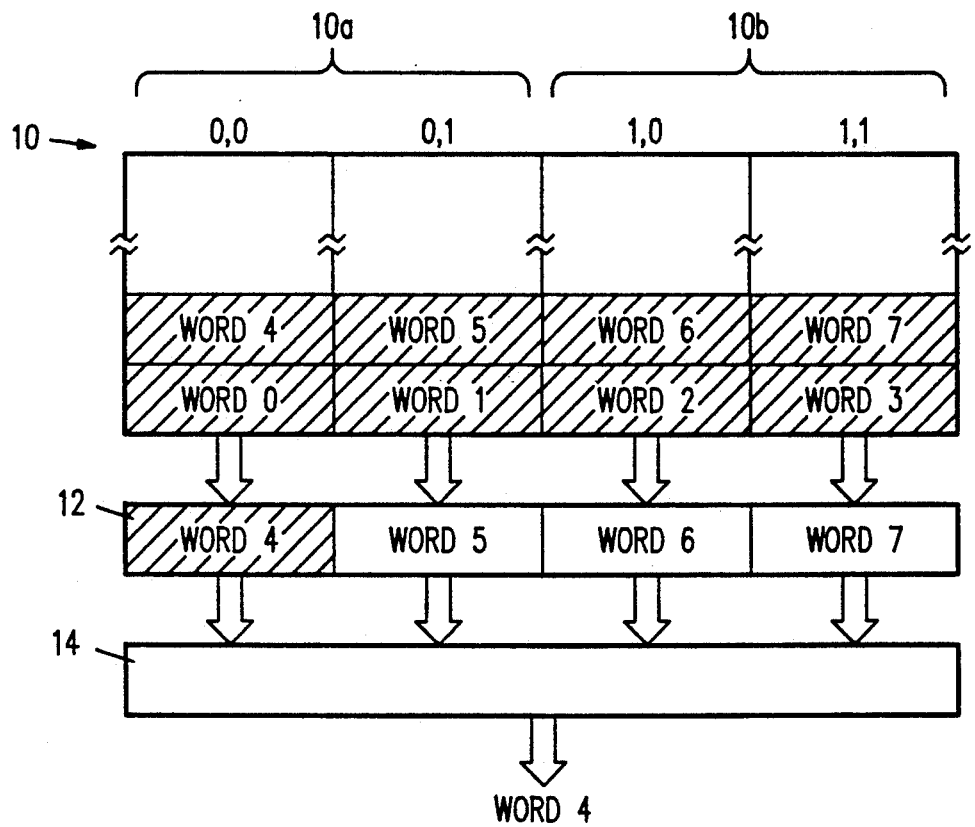

In this example, it is desired to begin reading data from address location $0000_H$ and continue reading data in a sequential mode for an undetermined number of data words. The IC memory device is first set to the standby mode, causing the IC to be idle. The interface signals sent to the IC request a read of the data word, Word 0, from address $0000_H$. Internally, the IC reads four data words, Words 0-3, from the lowest row in arrays 0,0, 0,1, 1,0, and 1,1, respectively, and holds them in Word Latches 0-3 of latches 12 and latches 13, respectively. The IC outputs Word 0 from Word Latch 0 as output data at the external interface of the IC as shown in FIG. 2A. Next, the interface signals request a read of the data word, Word 1, from address $0001_H$. However, this word and Words 1-3 have already been internally read and are being held in latches 12 and latches 13. Thus, the IC simply outputs Word 1 from Word Latch 1 as illustrated in FIG. 2B. When the interface signals request a read of the next data word, Word 2, from address $0002_H$, the IC similarly outputs Word 2 from Word Latch 2 and also at the same time internally reads data words, Words 4 and 5, from addresses $0004_H$ and $0005_H$, respectively, at the next higher row in lower group 10a. The IC holds Words 4 and 5 in Word Latches 0 and 1, respectively as shown in FIG. 2C. This read-ahead prepares the data for subsequent high speed output by placing the data words read from lower group 10a into latches 12 before they are requested for output. When the interface signals request a read of Word 3 from address $0003_H$, the IC similarly outputs Word 3 from Word Latch 3 as shown in FIG. 2D. The interface signals then requests a read of Word 4 from the next address $0004_H$. The IC simply outputs Word 4 previously read from array 0,0 from Word Latch 0 as output data. At the same time, it also internally reads data words, Words 6 and 7, from address $0006_H$ and $0007_H$ at the same row as the one in which Word 4 resides in lower group 10a and holds them in Word Latches 2 and 3, respectively as illustrated in FIG. 2E. Addresses $0004_H$, $0005_H$, $0006_H$ and $0007_H$ are sequential addresses in this order. The process continues in this way until the operator desires to stop at a particular address. Now, if it is desired that a memory location at a different address is to be accessed, the operator may simply send appropriate interface signals and address bits to address that location.

This method of reading a portion of the memory in anticipation of a subsequent read substantially increases the speed at which data can be presented at the external interface of the IC. The above example has used a starting address of $0000_H$, but the starting address may be any value.

Figure 3A:
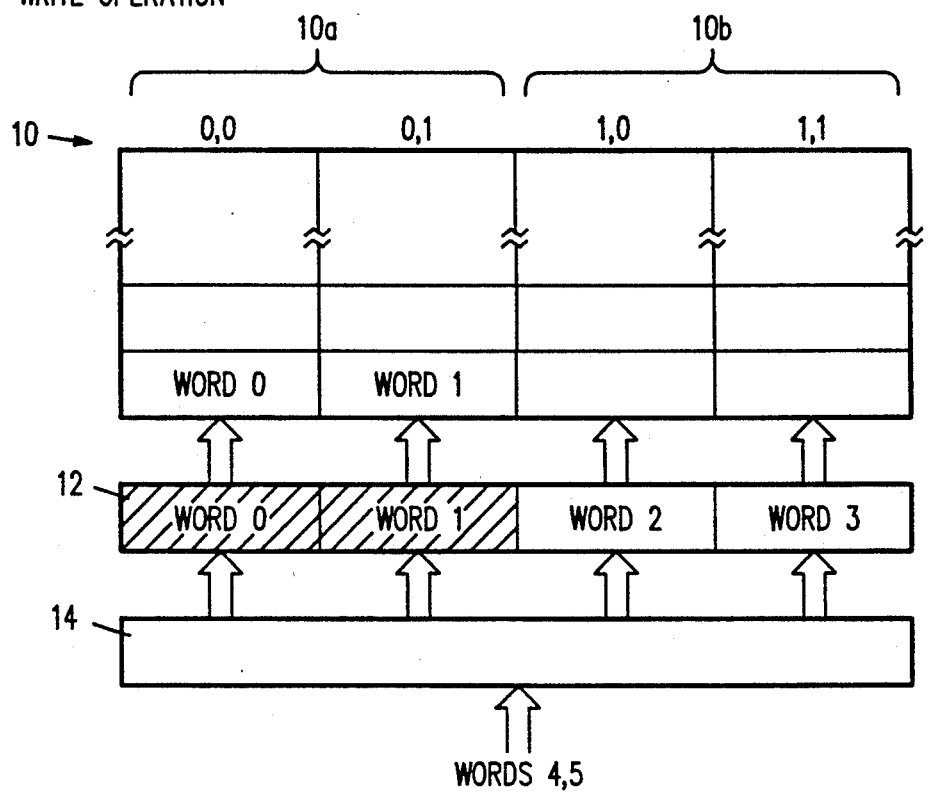
FIGS. 3A-3D illustrate an example of writing a series of sequential into the memory from the interface according to the invention.
Figure 3B:
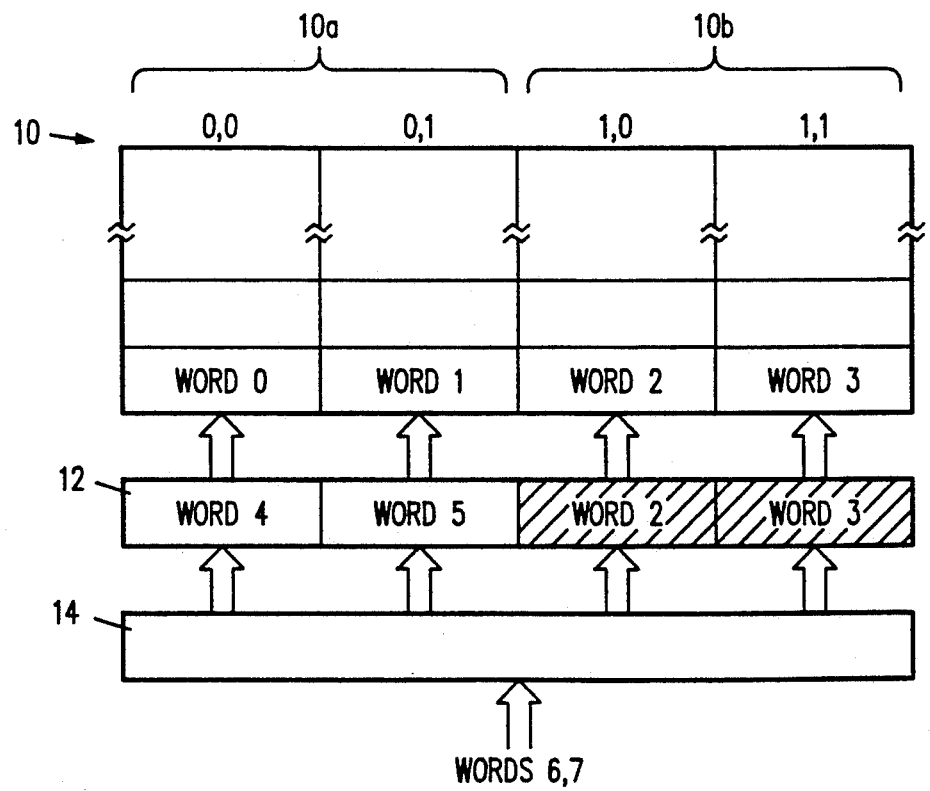

The write operation can similarly be performed. For example, to sequentially input a number of data words into the IC starting at address $0000_H$, Words 0-1 are first input and held in Word Latches 0-1, respective in latches 12 through buffers 14. Here, buffers 14 also functions as demultiplexer. Then, Words 0-1 are internally written into the memory locations $0000_H$ and $0001_H$ at the lowest row in lower group 10a. As Words 0 and 1 are being internally written into memory locations $0000_H$ and $00001_H$ from Word Latches 0 and 1, respectively, Words 2 and 3 are input into Word Latches 2 and 3 respectively, in latches 13, as shown in FIG. 3A. When the IC internally writes Words 2 and 3 into memory locations $0002_H$ and $0003_H$ at the lowest row in upper group 10b, Words 4 and 5 are also being input into Word Latches 0 and 1, respectively in latches 12 for being subsequently written into memory locations $0004_H$ and $0005_H$, respectively as shown in FIG. 3B.

Figure 3C:
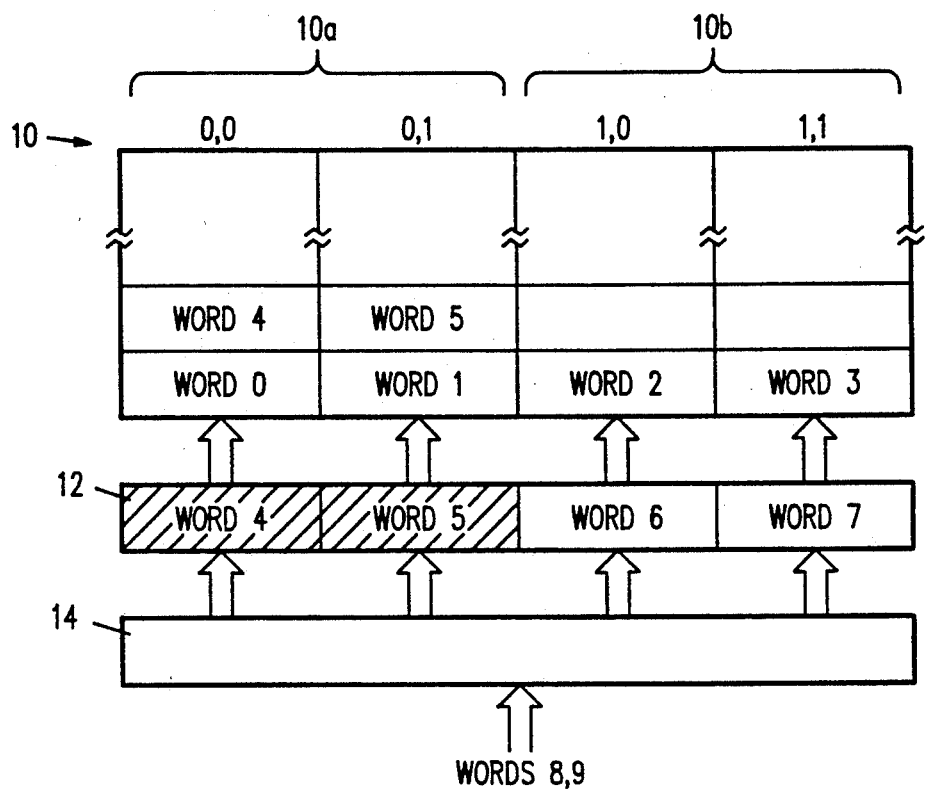
Figure 3D:
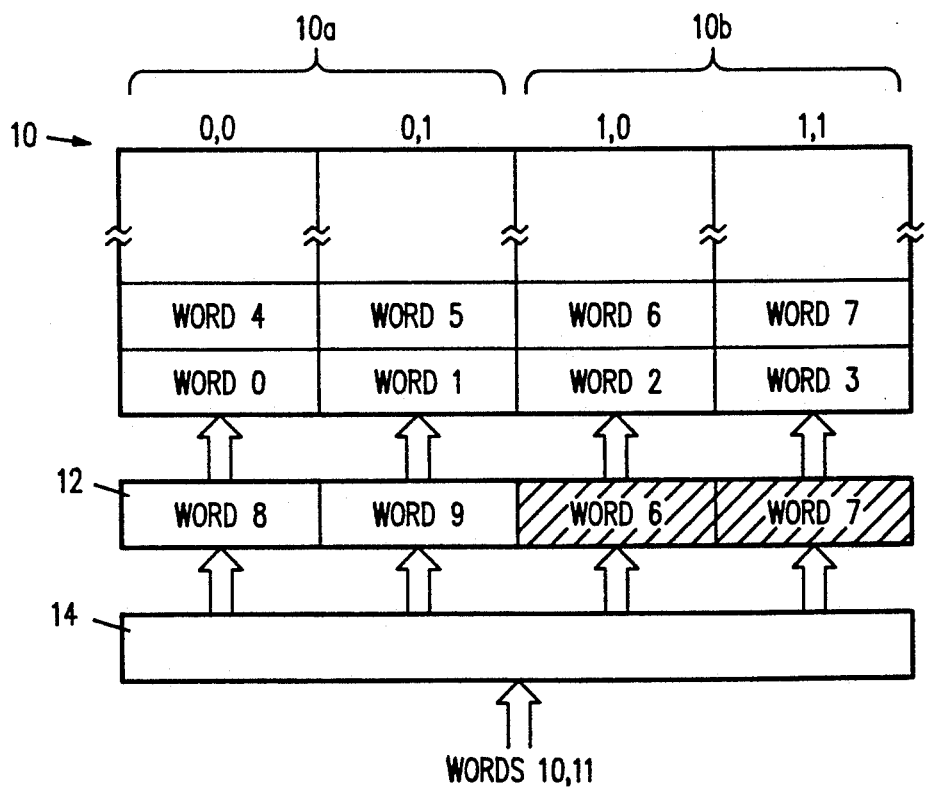

The process continues in this way until the last data word is written into the memory, as illustrated in FIGS. 3C-3D. Thus, the write operation is performed at high speed.

Figure 4A:
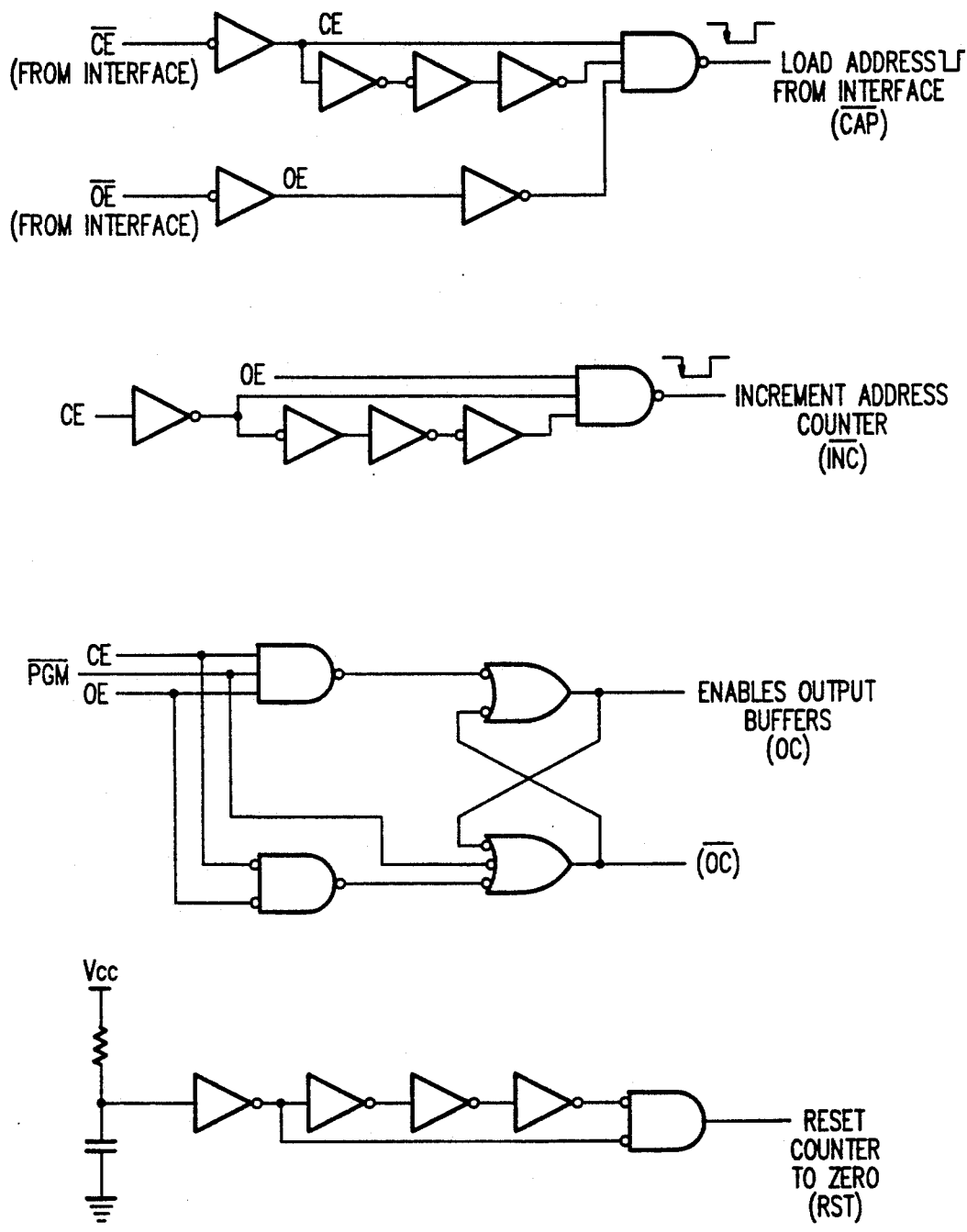
FIG. 4A shows a logic circuit included in the control logic unit for generating various control signals.

FIG. 4A shows a logic circuit included in control logic unit 20. The circuit generates various control signals to control the latch/counter, and output buffers.

Figure 4B:
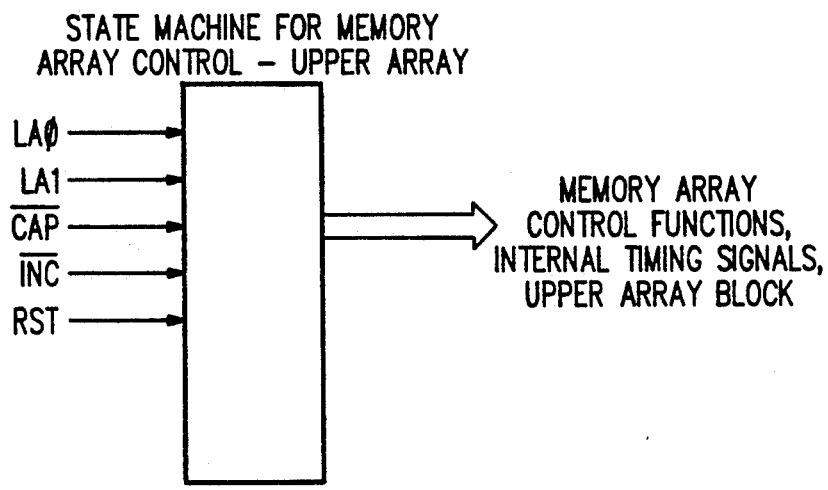
FIG. 4B shows a block diagram of a state machine included in the control logic unit for memory array controls.
Figure 4B:
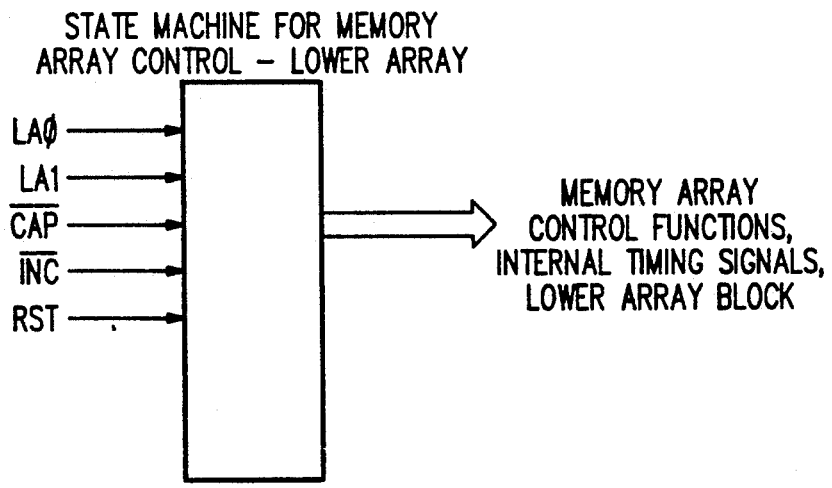

FIG. 4B shows a conventional state machines included in control logic unit 20 for memory array control. The state machine is duplicated for each memory array and provides enabling signals including LE upper and LE lower to control the respectively associated latches 13 and 12. The state machine also provides enabling signals to buffers 14 and other internal timing signals. The state machine is a known device. For example, a product DM450 available through National Semiconductor, Santa Clara, Calif. can be used for the state machine, although this state machine is included on the IC and is not a separate IC..

The remaining circuitry of control logic unit 20 comprises a standard 128k-bit EPROM such as a NM27C128 EPROM available through National Semiconductor, Santa Clara, Calif.

Figure 5A:
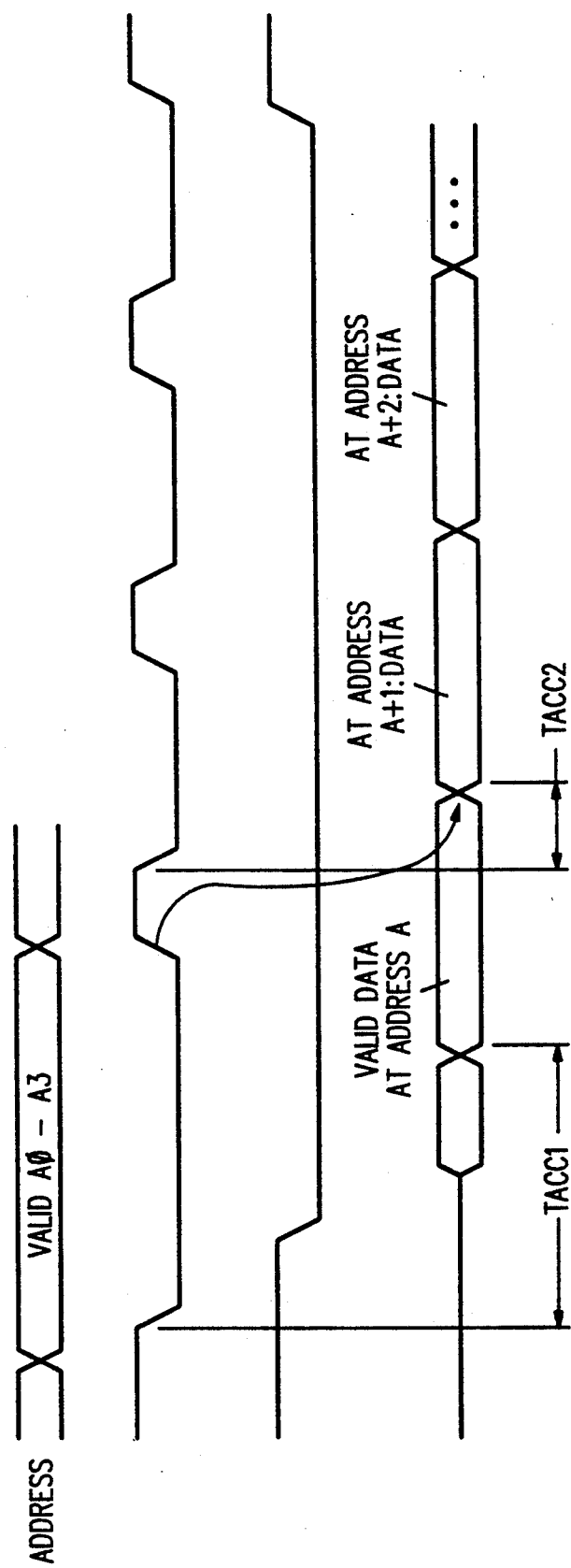
FIGS. 5A-5E shows a timing diagram illustrating the interface signals to the memory device for a read cycle according to the invention.

FIG. 5A shows a timing diagram illustrating the interface signals to the memory device for a read cycle according to the invention. Address A0-A13 is input to the memory device at the interface to define the starting address at which a high speed access starts. The addresses are held in the address latch/counter shown in FIG. 1.

Figure 5B:
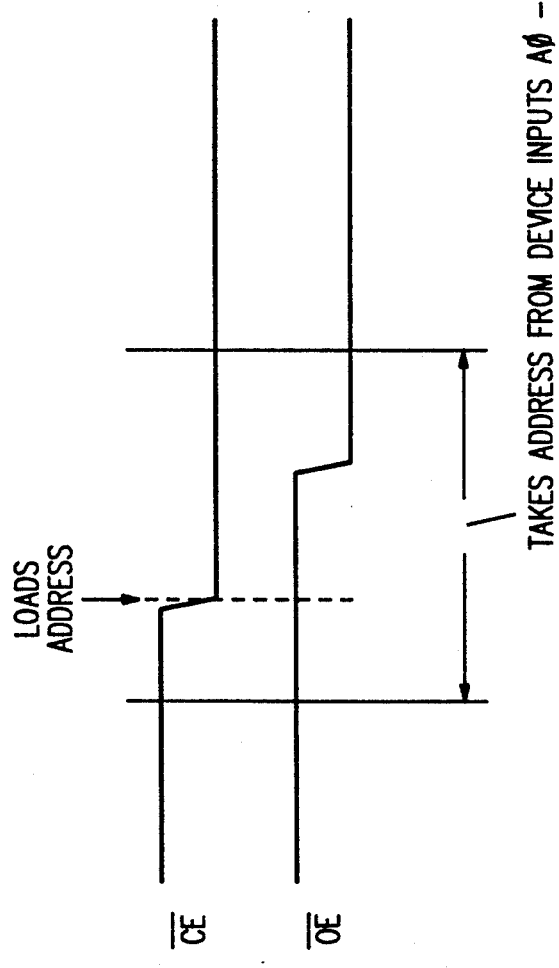
Figure 5D:
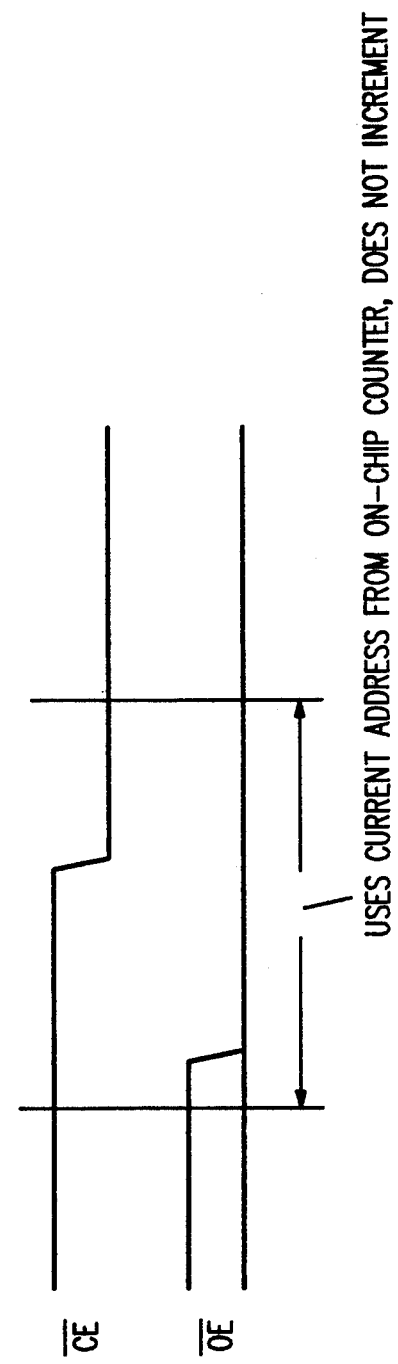
Figure 5C:
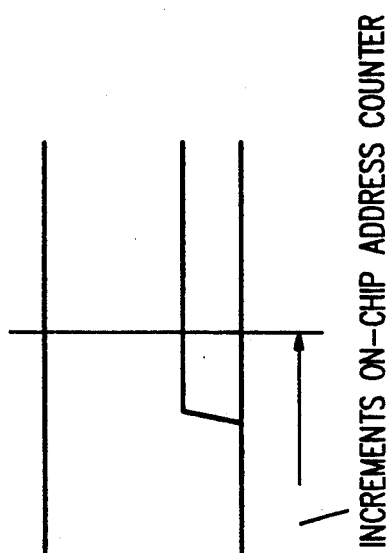
Figure 5E:
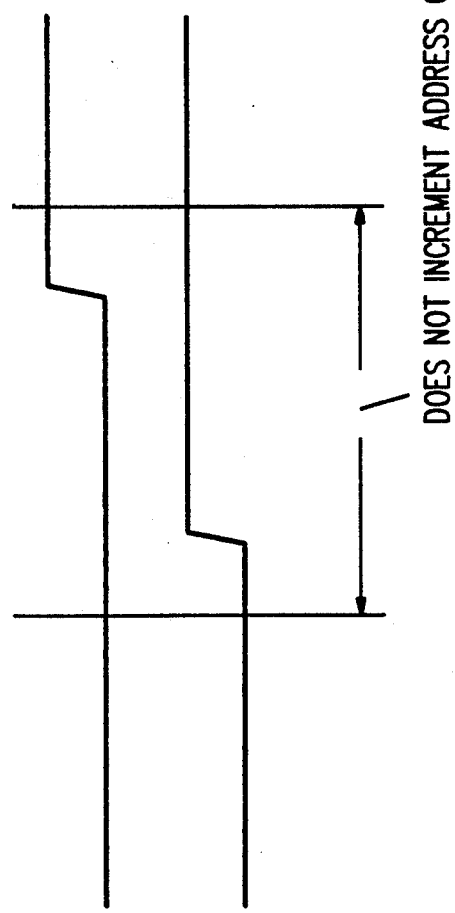

When $\overline{CE}$ transitions from high to low while $\overline{OE}$ is high, a new address is taken off the interface and loaded into the address latch/counter. This condition is also illustrated in FIG. 5B. When $\overline{CE}$ transitions from low to high while $\overline{OE}$ is low, the address counter is incremented as also shown in FIG. 5C. When $\overline{CE}$ transitions from high to low while $\overline{OE}$ is low, the addresses are not affected. This condition is also illustrated in FIG. 5D. Finally, when $\overline{CE}$ transitions from low to high, while $\overline{OE}$ is high, there is no effect on the addresses as also shown in FIG. 5E.

$\overline{CE}$ is Chip Select and has the primary function of acting on the address of the memory device. It is conditioned by $\overline{OE}$ as described above. When asserted, it initiates a memory access. $\overline{OE}$ is Output Enable and has the function of enabling the outputs of the memory device. It is also used to determine what action $\overline{CE}$ has on the address of the memory device.

To write the EPROM, typically Vpp or Programming Voltage, of +12 V is required to enter the program mode. The following truth table illustrates various modes of operation for the memory device of the invention.

| Mode | CE | OE | Vpp | Vcc | Outputs |
|---|---|---|---|---|---|
| Read | L | L | 5 | 5 | Dout |
| Standby | H | H | 5 | 5 | High - Z (High impedance) |
| Output Disable | L | H | 5 | 5 | High - Z (High impedance) |
| Program | L | H | 12 | 6 | Din |
| Verify | L | L | 12 | 6 | Dout |
| Program Inhibit | H | H | 12 | 6 | High - Z (High impedance) |
| Increment Address | ↑ | L | 5 | 5 | Data n + 1 |
| New Address | ↓ | H | 5 | 5 | Capture new address from A$\phi$-A13 Hi - Z (High impedance) |

The application of Vpp reverses the data direction and causes the memory to perform in the manner described above in connection with the preferred embodiment. It should be noted that a EPROM would not require high speed data input, although it could be implemented. Data input (write data) is applied to the same interface pins as the data output (read data), although with different timing and requires Vpp.

In FIG. 5A, tacc1 is an initial access time which is longer than a subsequent sequential access time tacc2.

The invention has now been described with reference to the preferred embodiment. Various substitution and modifications will be apparent to persons skilled in the relevant arts. Accordingly, the invention is not intended to be limited except as provided by the appended claims.

What is claimed is:

1. A multiple array memory device including memory and a data transfer path and formed on a single chip for allowing high speed transfers of a series of data between the memory and the data transfer path, comprising:

the memory having a plurality of groups of memory arrays;

means, coupled to said memory, for holding data to be transferred between said memory and the data transfer path; and means, coupled to said memory and said holding means, for controlling said memory and said holding means for transferring data between said memory and the data transfer path so that data transfers with respect to a selected number of sequential memory locations in said memory can be performed alternately between said memory and said holding means and between said holding means and the data transfer path wherein the data transfers with respect to said selected number of sequential memory locations are performed alternately on a group-by-group basis, thereby allowing sequential transfers of the series of data between said selected number of sequential memory locations and the data transfer path and wherein in a read cycle said controlling means causes data in said memory to be internally read into said holding means and on an alternate basis said controlling means causes data in said holding means to be output to the data transfer path, so that when data received from a group of arrays and held in said holding means are output to the data transfer path, sequential data in another group of arrays are internally read into said holding means if said sequential data are not being held in said holding means, whereby said controlling means can cause any desired number of sequential data to be output from said memory to the data transfer path at high speed.

2. A multiple array memory device according to claim 1 wherein during an initial read said controlling means causes data in sequential locations starting at any desired address and extending across said memory arrays to be internally read into said holding means.

3. A multiple array memory device according to claim 1 wherein in a write cycle said controlling means causes data from the data transfer path to be input into said holding means and on an alternate basis said controlling means causes data in said holding means to be internally written into said memory, so that when data for a corresponding group of arrays of said memory are written into said memory, sequential data for another group of arrays are input into said holding means if said sequential data are not being held in said holding means, whereby said controlling means can cause any desired number of sequential data to be input into said memory from the data transfer path at high speed.

4. A multiple array memory device according to claim 3 wherein during an initial write said controlling means causes sequential data for any group of memory arrays beginning at any desired address to be input into said holding means from the data transfer path.

5. A multiple array memory device including a memory and a data transfer path and formed on a single chip for allowing high speed transfers of a series of data between the memory and the data transfer path, comprising:

the memory having a plurality of groups of memory arrays;

buffer means, coupled to said memory, for holding data to be transferred between said memory and the data transfer path;

select means, coupled to said buffer means, for selectively transferring data between said buffer means and the data transfer path, and control means, coupled to said memory and said select means, for controlling said memory and said select means for transferring data between said memory and the data transfer path so that data transfers with respect to a selected number of sequential memory locations in said memory can be performed alternately on a group-by-group basis between said memory and said buffer means and between said buffer means and the data transfer path, thereby allowing sequential transfers of the series of data between said selected number of sequential memory locations and the data transfer path wherein in a read cycle said control means causes data in said memory to be internally read into said buffer means and on an alternate basis said select means outputs data in said buffer means to the data transfer path, so that when said select means outputs data received from a group of arrays to the data transfer path, sequential data in another group of arrays are internally read into said buffer means if said sequential data are not being held in said buffer means, whereby said control means can cause any desired number of sequential data to be output from said memory to the data transfer path at high speed.

6. A multiple array memory device according to claim 5 wherein during an initial read said control means causes data in sequential locations starting at any desired address and extending across said memory arrays to be internally read into said buffer means.

7. A multiple array memory device according to claim 5 wherein in a write cycle said select means inputs data into said buffer means and on an alternate basis said control means causes data in said buffer means to be internally written into said memory so that when data for a corresponding group of arrays of said memory are written into said memory, said select means inputs sequential data from the data transfer path into said buffer means to be written into another group of arrays if said sequential data are not being held in said buffer means, whereby said control means can cause any desired number of sequential data to be input into said memory from the data transfer path at high speed.

8. A multiple array memory device according to claim 7 wherein during an initial write said select means inputs sequential data from the data transfer path into said buffer means to be written into a group of memory arrays beginning at any desired address.

* * * * *